(12) United States Patent
Kim et al.

(10) Patent No.: US 10,861,361 B2
(45) Date of Patent: Dec. 8, 2020

(54) DISPLAY DEVICE

(71) Applicant: Samsung Display Co., Ltd., Yongin-si (KR)

(72) Inventors: Kwang-Min Kim, Seoul (KR); Won Kyu Kwak, Seongnam-si (KR); Seung-Kyu Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 183 days.

(21) Appl. No.: 16/105,593

(22) Filed: Aug. 20, 2018

(65) Prior Publication Data

US 2019/0057632 A1 Feb. 21, 2019

(30) Foreign Application Priority Data

Aug. 21, 2017 (KR) .................. 10-2017-0105712

(51) Int. Cl.
*G09G 3/00* (2006.01)
*H01L 27/32* (2006.01)
(Continued)

(52) U.S. Cl.
CPC ............ *G09G 3/006* (2013.01); *G09G 3/3225* (2013.01); *G09G 3/3233* (2013.01); *G09G 3/3266* (2013.01); *G09G 3/3291* (2013.01); *H01L 27/3276* (2013.01); *G09G 2300/0426* (2013.01); *G09G 2300/0809* (2013.01);
(Continued)

(58) Field of Classification Search
CPC ............ G09G 3/00; G09G 3/006; G09G 3/20; G09G 3/30; G09G 3/3233; G09G 3/3266; H01L 27/32; H01L 27/323; H01L 21/66; H01L 21/304; G06K 7/10; G02F 1/1362
See application file for complete search history.

(56) References Cited

U.S. PATENT DOCUMENTS

| 8,698,768 | B2 | 4/2014 | Lee et al. |
| 9,129,927 | B2 | 9/2015 | Gupta et al. |

(Continued)

FOREIGN PATENT DOCUMENTS

| JP | 2001-021912 | 1/2001 |
| JP | 2014-122974 | 7/2014 |
| KR | 10-2016-0148834 | 12/2016 |

*Primary Examiner* — Neel D Shah
(74) *Attorney, Agent, or Firm* — H.C. Park & Associates, PLC

(57) ABSTRACT

A display device includes a substrate includes a display area having a plurality of pixels, a pad area including a plurality of input pads, and a circuit area positioned between the pad area and the display area; a crack sensor having a first end and a second end, the first end being connected to a first input pad of the plurality of input pads; a first shorting element extending through the pad area, the first shorting element being connected to the second end and extending to an edge of the substrate; a plurality of data lines connected to the plurality of pixels; and a crack sensing circuit including a first switching element having an input terminal connected to the first end and an output terminal connected to a first data line of the plurality of data lines, and a second switching element having an input terminal connected to the second end and an output terminal connected to a second data line of the plurality of data lines.

20 Claims, 13 Drawing Sheets

(51) Int. Cl.
*G06K 7/10* (2006.01)
*G02F 1/1362* (2006.01)
*G09G 3/3291* (2016.01)
*G09G 3/3266* (2016.01)
*G09G 3/3233* (2016.01)
*G09G 3/3225* (2016.01)

(52) U.S. Cl.
CPC ............ *G09G 2300/0819* (2013.01); *G09G 2300/0842* (2013.01); *G09G 2330/021* (2013.01); *G09G 2330/12* (2013.01); *H01L 27/3246* (2013.01); *H01L 27/3258* (2013.01)

(56) References Cited

U.S. PATENT DOCUMENTS

| | | |
|---|---|---|
| 9,581,841 B2 | 2/2017 | Yangisawa |
| 9,875,676 B2 | 1/2018 | Byun et al. |
| 2014/0176844 A1 | 6/2014 | Yanagisawa |
| 2016/0043010 A1* | 2/2016 | Kwak .................. H01L 27/124 257/48 |
| 2016/0232826 A1* | 8/2016 | Cho .................... H01L 27/3276 |
| 2016/0372017 A1* | 12/2016 | Byun ...................... G09G 3/20 |

* cited by examiner

DISPLAY DEVICE

CROSS-REFERENCE TO RELATED APPLICATION

This application claims priority from and the benefit of Korean Patent Application No. 10-2017-0105712, filed on Aug. 21, 2017, which is hereby incorporated by reference for all purposes as if fully set forth herein.

BACKGROUND

Field

Exemplary implementations of the invention relate generally to a display device, and more particularly, to a display device capable of detecting defects such as cracks and/or protecting internal components from static electricity.

Discussion of the Background

A display device such as a liquid crystal display (LCD) and an organic light emitting diode (OLED) display includes a display panel including a plurality of pixels displaying images, and a plurality of signal lines. Each pixel may include a pixel electrode receiving a data signal, and the pixel electrode may be connected to at least one transistor to receive the data signal. The display panel may include a plurality of stacked layers.

In the manufacturing process of the display panel, when the display panel receives an impact, a crack may be generated in the substrate or on a layer laminated thereon. The crack may grow larger or spread to other layers or other areas as time passes, so failure of the display panel may occur. For example, if a crack is generated in the signal lines such as a data line or a scan line, the signal lines may be disconnected or resistance thereof may be increased, or moisture etc. may penetrate inside the display panel through the crack, thereby the reliability of the device may be reduced. Then, problems such as the pixels of the display panel not emitting or other malfunction may occur.

Particularly, a flexible display device, which has been developed recently, may be bent and warped during manufacture or use, and if even a fine crack exists in the substrate or the laminated layer of the display panel, even if there is no problem initially, the fine crack may grow into larger crack due to the bending or the warping of the display panel as time passes.

The above information disclosed in this Background section is only for understanding of the background of the inventive concepts, and, therefore, it may contain information that does not constitute prior art.

SUMMARY

Display devices constructed according to exemplary implementations and the principles of the invention are capable of detecting defects in internal components, such as cracks that may be generated during manufacture, and/or protecting internal components from static electricity.

Additional features of the inventive concepts will be set forth in the description which follows, and in part will be apparent from the description, or may be learned by practice of the inventive concepts.

According to one aspect of the invention, a display device includes a substrate including a display area having a plurality of pixels, a pad area having a plurality of input pads, and a circuit area positioned between the pad area and the display area; a crack sensor having a first end and a second end, the first end being connected to a first input pad of the plurality of input pads; a first shorting element extending through the pad area, the first shorting element being connected to the second end and extending to an edge of the substrate; a plurality of data lines connected to the plurality of pixels; and a crack sensing circuit including a first switching element having an input terminal connected to the first end and an output terminal connected to a first data line of the plurality of data lines, and a second switching element having an input terminal connected to the second end and an output terminal connected to a second data line of the plurality of data lines.

The crack sensor may further include a part extending along a periphery of the display area connected between the first end and the second end.

The display device may further include a second shorting element connected to the first input pad and extending to the edge of the substrate.

The display device may further include a first test data line connecting the first end and the first switching element to each other, and a second test data line connecting the second end and the second switching element to each other.

The display device may further include a first wire connecting the first end and the first input pad to each other. The first shorting element may include a part extending substantially parallel to the first wire.

The substrate may further include a bending area positioned between the display area and the circuit area, the crack sensor may include a part positioned at the bending area, the display device may further include a voltage transmitting line having a part extending along a periphery of the display area and a part extending through the bending area. The voltage transmitting line and the crack sensor may be positioned at the same layer in the bending area.

The crack sensor may further include a line having a generally looped shape extending back and forth once or more times within the bending area, and the line is connected between the first end and the second end.

The first shorting element may be positioned between the bending area and the edge of the substrate.

The substrate may further include a bending area positioned between the circuit area and the pad area, the first shorting element may intersect the bending area, the display device may further include a voltage transmitting line having a part extending along a periphery of the display area and a part extending through the bending area, and the voltage transmitting line and the first shorting element may be positioned at the same layer in the bending area.

The first shorting element may be positioned at the same layer as the plurality of data lines at the edge of the substrate.

The display device may further include a lighting circuit connected to the plurality of data lines and positioned between the edge of the substrate and the crack sensing circuit, and the first shorting element may include a part positioned between the lighting circuit and the first input pad.

The crack sensor may include a line and the first shorting element may include a wire.

According to another aspect of the invention, a display panel includes: a substrate including a display area having a plurality of pixels, a pad area having a plurality of input pads, and a circuit area positioned between the pad area and the display area; a crack sensor having a first end connected to a first input pad of a plurality of input pads and a second end; a plurality of data lines connected to the plurality of pixels; a shorting member transmitting a predetermined voltage; a first shorting element passing through the pad area, the first shorting wire being connected between the second end and the shorting member; and a crack sensing circuit including a first switching element having an input terminal connected to the first end and an output terminal connected to a first data line of the plurality of data lines, and a second switching element having an input terminal connected to the second end and an output terminal connected to a second data line of the plurality of data lines.

The crack sensor may further include a part extending along a periphery of the display area connected between the first end and the second end.

The display panel may further include a second shorting element connected to the first input pad and connected to the shorting member.

The display device may further include a first wire connecting the first end and the first input pad to each other. The first shorting element may include a part extending substantially parallel to the first wire.

The substrate may further include a bending area positioned between the display area and the circuit area, and the first shorting element may be positioned between the bending area and the shorting member.

The crack sensor may further include a line having a generally looped shape extending back and forth once or more times within the bending area, and the line is connected between the first end and the second end.

The first shorting element may include a part positioned at the same layer as the plurality of data lines.

The display device may further include a lighting circuit connected to the plurality of data lines and positioned between the shorting member and the crack sensing circuit, and the first shorting element may include a part positioned between the lighting circuit and the first input pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
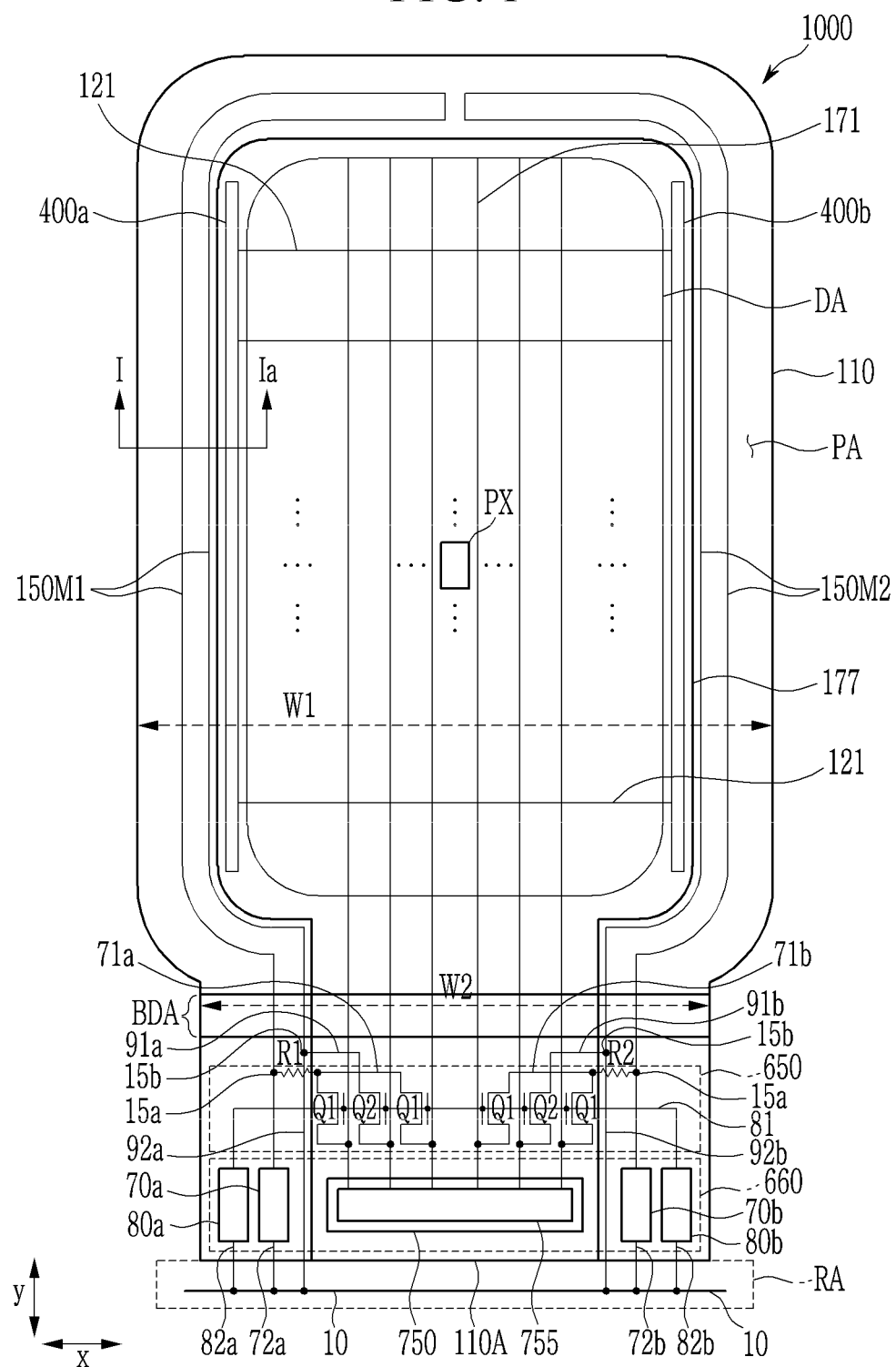
FIG. 1 is a top plan view of an exemplary embodiment of a display panel included in a display device constructed according to the principles of the invention.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x direction, the y direction, and the z direction are not limited to three directions of a rectangular coordinate system, and may be interpreted in a broader sense. For example, the x direction, the y direction, and the z direction may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 2:
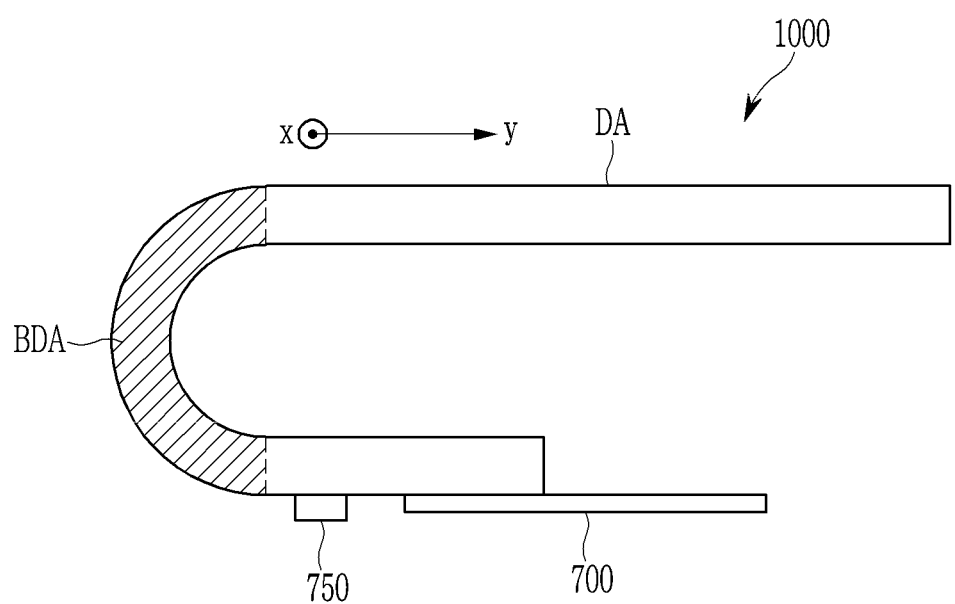
FIG. 2 is a side view showing the display panel of FIG. 1 in a bent position.

Referring to FIG. 1 and FIG. 2, a display device may include a display panel 1000 having a display area DA for displaying an image and a non-display area that includes all areas except for the display area DA. The display panel 1000 includes a substrate 110. That is, substrate 110 may include the display area DA and its outer area, may be a non-display area. The substrate 110 may include glass, plastic, etc., and may have flexibility. For example, when the substrate 110 has flexibility, the substrate 110 may be composed of various plastics such as PET, PEN, PC, PAR, PEI, PES, or PI, a metal thin film, or a thin film glass.

The display area DA may display the image on a surface parallel to an x direction and a y direction. Hereinafter, a structure observed when viewing in a direction perpendicular to the x direction and the y direction is referred to as a plane structure, and a structure observed along a line cut along the direction perpendicular to the x direction and the y direction is referred to as a cross-sectional structure.

The display area DA includes a plurality of pixels PX and a plurality of signal lines.

The signal lines include a plurality of gate lines 121 transmitting a gate signal and a plurality of data lines 171 transmitting a data signal. Each gate line 121 approximately extends in the x direction in the display area DA and may be connected to gate drivers 400a and 400b outside the display area DA. The data line 171 approximately extends in the y direction in the display area DA, and also extends outside the display area DA.

The pixel PX may include at least one switching element and a pixel electrode connected thereto. The switching element may be a three-terminal element such as a transistor integrated on the display panel 1000. The switching element is turned on or turned off depending on the gate signal transmitted by the gate line 121, thereby selectively transmitting the data signal to the pixel electrode.

In order to implement a color display, each pixel PX may display one of predetermined colors, and an image of a desired color may be recognized by combining images displayed by the predetermined colors. An example of the predetermined colors displayed by the plurality of pixels PX may be three primary colors of red, green, and blue, or three primary colors of yellow, cyan, and magenta, and at least one different color such as white may be further included as well as the three primary colors.

The non-display area may be positioned outside the display area DA, as shown in FIG. 1, and while it is referred to as a non-display area, it may include an area displaying the image if necessary. The non-display area may include a peripheral area PA positioned around the display area DA, a bending area BDA, a circuit area 650, a pad area 660, etc.

The peripheral area PA positioned around the display area DA may be an area adjacent to the display area DA and surrounding the display area DA. The bending area BDA may be positioned under a lower side of the display area DA, and may extend across the display panel 1000 in the x direction. The pad area 660 may be positioned at one edge of the display panel 1000, and may be positioned outside the bending area BDA. That is, the bending area BDA may be positioned between the display area DA and the pad area 660. The circuit area 650 includes a plurality of electrical elements such as transistors and may be positioned under the lower side of the display area DA. As shown in FIG. 1, the circuit area 650 may be positioned between the bending area BDA and the pad area 660, of alternatively, it may be positioned between the display area DA and the bending area BDA or at the peripheral area PA on an upper side of the display area DA.

The peripheral area PA may include the gate drivers 400*a* and 400*b*, voltage transmitting lines 177, and crack sensing lines 150M1 and 150M2.

The gate drivers 400*a* and 400*b* are connected to the plurality of gate lines 121, for applying the gate signal. The gate drivers 400*a* and 400*b* may be formed on the substrate 110 along with the plurality of signal lines and the switching element positioned on the display area DA. FIG. 1 shows an example in which the gate drivers 400*a* and 400*b* are positioned on the right and left sides, respectively, of the display area DA, however the inventive concepts are not limited thereto. For example, either one of the gate drivers 400*a* and 400*b* may be omitted.

The voltage transmitting line 177 may extend along at least three sides such as the right and left sides and the upper side of the display area DA, and may transmit a predetermined voltage such as a common voltage ELVSS.

Each of the crack sensing lines 150M1 and 150M2, which may also be referred to as a crack sensor, may have two ends, one end 15*a* and another end 15*b*, and may be disposed in a shape that extends along the circumference of the left side and a part of the upper side, or along the circumference of the right side and a part of the upper side of the display area DA between the one end 15*a* and the other end 15*b*. For example, the crack sensing line 150M1 may include a part approximately extending to be elongated in the y direction in the left peripheral area PA of the display area DA and a part approximately extending to be elongated in the x direction in the upper peripheral area PA of the left half of the display area DA, and the crack sensing line 150M2 may include a part approximately extending to be elongated in the y direction in the right peripheral area PA of the display area DA and a part approximately extending to be elongated in the x direction in the upper peripheral area PA of the right half of the display area DA.

Each of the crack sensing lines 150M1 and 150M2 may start from the one end 15*a* connected to the pad area 660, extend along the circumference of the display area DA in the peripheral area PA through the bending area BDA, be looped at least once in the right/left or upper peripheral area PA display area DA to form at least one bending part, and again pass through the bending area BDA to be connected to the circuit area 650 at the other end 15*b*. The one end 15*a* of the crack sensing lines 150M1 and 150M2 is connected to the pad area 660 to receive a test voltage.

When a cross-sectional position of a conductive layer positioned at the bending area BDA and a cross-sectional position of the crack sensing lines 150M1 and 150M2 positioned at the peripheral area PA are not equal, the crack sensing lines 150M1 and 150M2 may include at least one contact part positioned above and below the bending area BDA. The crack sensing lines 150M1 and 150M2 may include parts positioned on different layers in a cross-section with respect to the contact part. The contact part may include at least one contact hole. The detailed structure thereof will be described later.

Unlike FIG. 1, the left and right crack sensing lines 150M1 and 150M2 may be connected to each other in the display area DA. In this case, the connection relationship of the circuit area 650 and/or the pad area 660 of the crack sensing lines 150M1 and 150M2 may be changed.

In a plan view, in the peripheral area PA positioned at the right/left sides of the display area DA, the gate drivers 400*a* and 400*b* may be positioned between the edge of the display area DA and the voltage transmitting line 177, the voltage transmitting line 177 may be positioned between the gate drivers 400*a* and 400*b* and the crack sensing lines 150M1 and 150M2, and the crack sensing lines 150M1 and 150M2 may be positioned between the voltage transmitting line 177 and the edge of the substrate 110. However, the arrangement of these constituent elements may be changed in other ways.

As shown in FIG. 2, display panel 1000 is bendable in the bending area BDA such that the part positioned outside the bending area BDA wraps behind the display panel 1000 and may be not seen from the front. FIG. 1 shows the expanded position in which the display panel 1000 is spread flat in the bending area BDA without bending, and FIG. 2 schematically shows the compact position in which the display panel 1000 is bent in the bending area BDA. The plurality of wires may pass through the bending area BDA, and the plurality of wires may approximately extend in the y direction in the bending area BDA. At least part of the substrate 110 may be removed in the bending area BDA.

A width W1 of the area including the display area DA and the peripheral area PA positioned at the right and left thereof in the x direction may be larger than a width W2 of the bending area BDA in the x direction.

The bending area BDA may be omitted depending on the structure of the display device.

Referring to FIG. 1 and FIG. 2, the pad area 660 may include a plurality of pads that may be electrically connected to a pad of a driving chip 750 and/or a pad of a circuit film 700 such as Printed Circuit Board (PCB). Accordingly, the display device according to an exemplary embodiment may further include the driving chip 750 and/or the circuit film 700 that are/is electrically connected to the display panel 1000 through the pad area 660.

As shown in FIG. 2, the driving chip 750 may be positioned on the display panel 1000 or on the circuit film 700. The driving chip 750 may include a driver for generating a driving signal to drive the display panel 1000.

The circuit film 700 may be a film type. Referring to FIG. 2, the circuit film 700 may be connected to the area outside the bending area BDA when bending the display panel 1000. The driver, a timing controller, etc. may be positioned in the circuit film 700.

A plurality of pads included in the pad area 660 may include first input pads 70*a* and 70*b* and second input pads 80*a* and 80*b*.

The circuit area 650 is connected to the crack sensing lines 150M1 and 150M2, and includes a crack sensing circuit capable of sensing the defect that is generated in the substrate 110 or the layers deposited on the substrate 110 such as a crack, and lifting at the peripheral area PA through a resistance change of the crack sensing lines 150M1 and 150M2. The resistance change of the crack sensing lines 150M1 and 150M2 may be confirmed by testing a lighting state of the display area DA through the crack sensing circuit.

To describe the crack sensing circuit in detail, one end 15*a* of the crack sensing lines 150M1 and 150M2 is connected to the first input pads 70*a* and 70*b* of the pad area 660. The one end 15*a* of the crack sensing lines 150M1 and 150M2 connected to the input pads 70*a* and 70*b* also may be connected to first test data lines 71*a* and 71*b*. The other end 15*b* of the crack sensing lines 150M1 and 150M2 may be connected to second test data lines 91*a* and 91*b*.

Each of the first test data lines 71a and 71b may be separated from each other and not electrically connected, and each of the second test data lines 91a and 91b may also be separated from each other and not electrically connected. Each of the first and second test data lines 71a, 71b, 91a, and 91b may approximately extend in the x direction and may cross the data lines 171, while being insulated therefrom.

The crack sensing circuit of the circuit area 650 may further include a test gate line 81 and a plurality of switching elements Q1 and Q2 connected thereto.

The test gate line 81 is connected to the second input pads 80a and 80b and may extend approximately in the x direction in the circuit area 650. The test gate line 81 may receive the gate signal for the test through the second input pads 80a and 80b.

First switching elements Q1 and second switching elements Q2 may be arranged in one row or a plurality of rows approximately extending in the x direction, and may be disposed to connect to a respective one of the plurality of data lines 171. FIG. 1 shows an example in which the plurality of the first and second switching elements Q1 and Q2 are arranged in one row. The first and second switching elements Q1 and Q2 may be alternately arranged in a column in the y direction, and each of the first and second switching elements Q1 and Q2 may be connected to a respective one of each data line 171. The second switching element Q2 may be disposed in a partial area of the circuit area 650, for example, a right partial area and a left partial area of the circuit area 650, and the first switching elements Q1 may be disposed in the remaining area. FIG. 1 shows an example in which one second switching element Q2 is positioned at both the left side and the right side of the circuit area 650, but alternatively, a plurality of second switching elements Q2 may be positioned to be adjacent in the x direction at the right side and the left side of the circuit area 650. Also, the arrangement of the first and second switching elements Q1 and Q2 may be variously changed.

A gate terminal of each first and second switching elements Q1 and Q2 is connected to the test gate line 81 and an output terminal thereof is connected to the corresponding data line 171. An input terminal of the first switching element Q1 is connected to the first test data lines 71a and 71b, and an input terminal of the second switching element Q2 is connected to the second test data lines 91a and 91b.

Referring to FIG. 1, the first test data lines 71a and 71b between the first input pads 70a and 70b and the first switching element Q1 may include matching resistors R1 and R2. The test voltage applied through the first input pads 70a and 70 may be applied to the input terminal of the first switching element Q1 after being decreased by a first voltage difference via the matching resistors R1 and R2. On the other hand, the test voltage applied through the first input pads 70a and 70b may be transmitted to the crack sensing lines 150M1 and 150M2, and the voltage that is decreased by a second voltage difference by a wire resistance of the crack sensing lines 150M1 and 150M2 may be applied to the input terminal of the second switching element Q2 through the second test data lines 91a and 91b. The resistance of the matching resistors R1 and R2 may be equal or similar to the wire resistance of the crack sensing lines 150M1 and 150M2. Also, the resistance of the matching resistors R1 and R2 may be determined so that the first voltage difference and the second voltage difference are substantially equal or equivalent to each other in the case where there is no damage such as the crack or the lifting in the crack sensing lines 150M1 and 150M2 being in a normal state. However, the inventive concepts are not limited thereto, and the resistance of the matching resistors R1 and R2 may be determined as an appropriate value depending on crack detection sensitivity. For example, the resistance of the matching resistors R1 and R2 may be determined to be approximately 1.5 times the wire resistance of the crack sensing lines 150M1 and 150M2.

The data line 171 may also extend below the circuit area 650 and may be connected to a lighting circuit 755, which is also referred to as an inspection circuit, for testing the defect of the display area DA. For example, the lighting circuit 755 may provide the signal to the data lines 171 for lighting test of the pixels PX connected to the data lines 171. The lighting circuit 755 may include electrical elements such as a plurality of transistors, etc. The lighting circuit 755 may be positioned below or above the display area DA. FIG. 1 shows an example in which the lighting circuit 755 is positioned at the pad area 660, particularly the area where the driving chip 750 is positioned.

Referring to FIG. 1, the display panel 1000 further includes first shorting wire 92a and 92b, which may also be referred to as first shorting elements, connected to the other end 15b of the crack sensing line 150M1 and 150M2 connected to the second test data lines 91a and 91b. The first shorting wires 92a and 92b start from the other end 15b of the crack sensing lines 150M1 and 150M2, pass through the pad area 660, and extend to a lower edge 110A of the display panel 1000 or the substrate 110 positioned under the pad area 660. Each of the first shorting wires 92a and 92b may be insulated from other signal lines such as the test gate line 81 to be crossed. The lower edge 110A is a lower edge of the completed display panel 1000 or substrate 110, and the edge may not yet be formed during the manufacturing process.

Second shorting wires 72a, 72b, 82a, and 82b, which may also be referred to as second shorting elements, may be also connected to the first and second input pads 70a, 70b, 80a, and 80b, respectively. The second shorting wires 72a, 72b, 82a, and 82b may extend from the first and second input pads 70a, 70b, 80a, and 80b to the lower edge 110A of the display panel 1000 or substrate 110 positioned below the pad area 660.

The ends of the first shorting wires 92a and 92b and the second shorting wires 72a, 72b, 82a, and 82b that terminate at the lower edge 110A are not connected to other conductors and may be in a floating state.

FIG. 1 further shows a removal area RA that is formed in the manufacturing process of the display panel 1000, but is removed in a cutting process of each display panel 1000 such that it is not included in the completed display panel 1000. That is, the display panel 1000 during the manufacturing process may further include the removal area RA positioned below the lower edge 110A of the completed display panel 1000 or substrate 110. In the removal area RA, a shorting bar 10 capable of transmitting a predetermined voltage such as a ground voltage may be positioned. The shorting bar 10 may extend to be approximately parallel to the x direction. The above-described first shorting wires 92a and 92b and second shorting wires 72a, 72b, 82a, and 82b are connected to the shorting bar 10 during the manufacturing process for transmitting the predetermined voltage such as the ground voltage. Accordingly, during the manufacturing process of the display panel 1000, one end 15a and the other end 15b of the crack sensing lines 150M1 and 150M2 may maintain the same potential in the crack sensing circuit.

If there are no static electricity discharge elements such as the first shorting wires 92a and 92b connected to the other end 15b of the crack sensing lines 150M1 and 150M2, the crack sensing lines 150M1 and 150M2 having relatively large resistance serve as an antenna such that a large potential difference between one end 15*a* and the other end 15*b* of the crack sensing lines 150M1 and 150M2 may be easily generated. In that case, the static electricity tends to accumulate in the other end 15*b* of the crack sensing lines 150M1 and 150M2, so that the crack sensing circuits connected to the crack sensing lines 150M1 and 150M2 may be vulnerable to the static electricity, and a leakage current maybe generated in the switching element Q2 connected to the other end 15*b* of the crack sensing lines 150M1 and 150M2. In this case, in another different defect testing step that is not a step for testing the defect such as the crack of the peripheral area PA, for example, in the defect testing step of the display area DA using the lighting circuit 755, the lighting state of the pixel PX connected to the data line 171 connected to the second switching element Q2 may be erroneously displayed in the defect state. That is, even if there is no defect in the data line 171 connected to the second switching element Q2 or the pixel PX connected thereto, the pixel PX column connected to the corresponding data line 171 is displayed in a weak dark line such that a defect may be erroneously detected.

However, in the display panel 1000 according to an exemplary embodiment, as above-described, the other end 15*b* of the crack sensing lines 150M1 and 150M2 is connected to the shorting bar 10 through the first shorting wires 92*a* and 92*b* to be transmitted with the predetermined voltage such as the same ground voltage as the one end 15*a* of the crack sensing lines 150M1 and 150M2, thereby the potential difference of the one end 15*a* and the other end 15*b* of the crack sensing lines 150M1 and 150M2 may be substantially maintained as zero. Accordingly, the damage due to the static electricity of the second switching element Q2 of the crack sensing circuit may be effectively reduced or prevented and the leakage current of the second switching element Q2 may be effectively reduced or prevented, thereby minimizing or eliminating the potential for the erroneous detection of a defect in the defect testing step of the display area DA.

Figure 3:
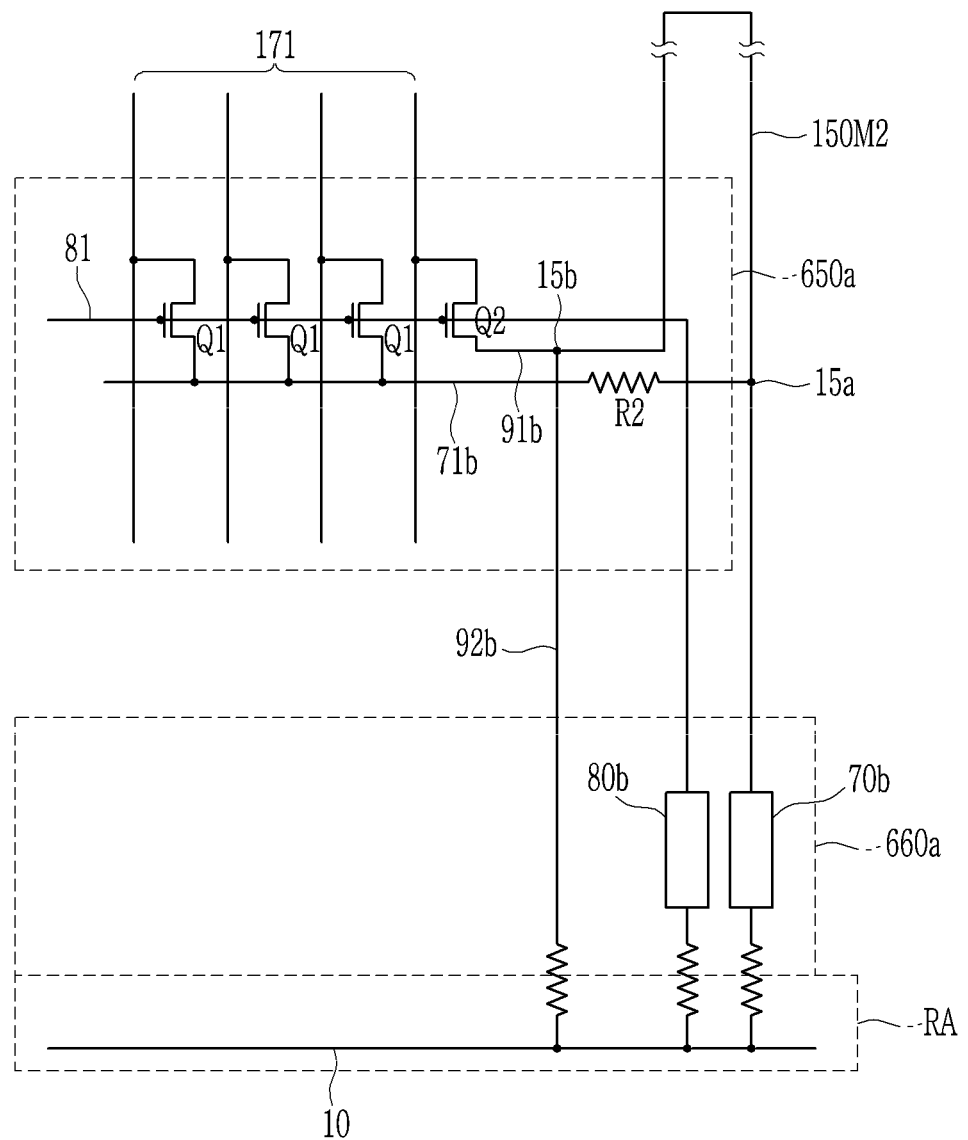
FIG. 3 is a schematic view showing part of an embodiment of a crack sensing circuit area of the display panel of FIG. 1.

FIG. 3 shows the structure of the circuit area 650 and the pad area 660 of the display panel 1000 shown in FIG. 1 according to another exemplary embodiment. A circuit area 650*a* and a pad area 660*a* of the display panel according to this exemplary embodiment are the same as most of the circuit area 650 and the pad area 660 of the display panel 1000 according to the exemplary embodiment of FIG. 1, however one second switching element Q2 may be positioned at the right part of the circuit area 650*a*, and the plurality of first switching elements Q1 may be disposed adjacent to the second switching element Q2 to be adjacent to each other. The right/left arrangement of the first input pads 70*b* and 80*b* positioned at the pad area 660*a* may be opposite to the right/left arrangement in the pad area 660 of the above-described display panel 1000 of FIG. 1.

Figure 4:
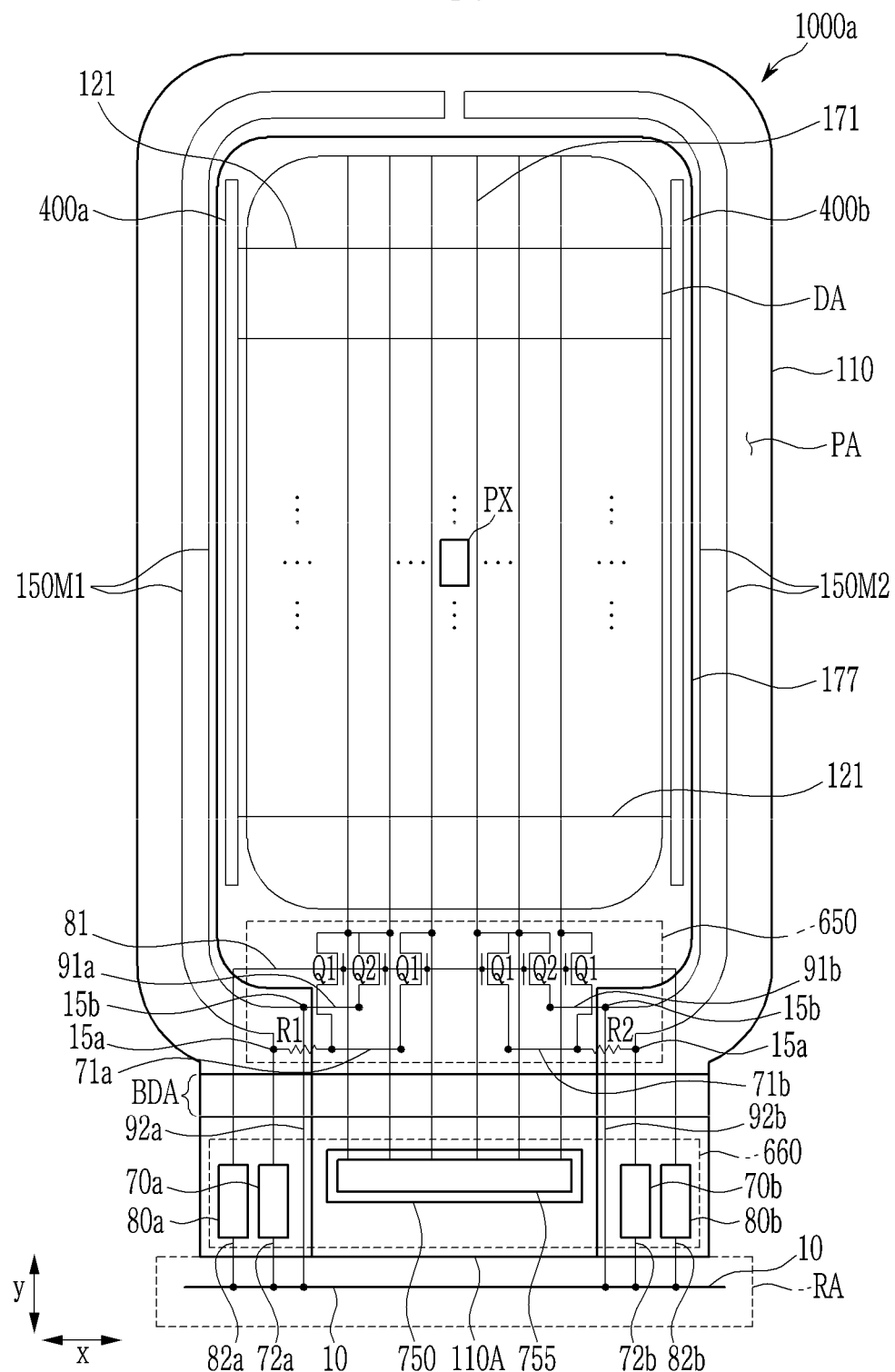
FIG. 4 and FIG. 5 are top plan views of other exemplary embodiments of a display panel included in a display device constructed according to the principles of the invention.

Referring to FIG. 4 along with the above-described drawings, a display panel 1000*a* included in the display device is substantially the same as most of the display panel 1000 according to the exemplary embodiment shown in FIG. 1 and FIG. 2, however the circuit area 650 in which the crack sensing circuit is positioned may be positioned between the display area DA and the bending area BDA.

Accordingly, the wire connecting one end 15*a* of the crack sensing lines 150M1 and 150M2 and the first input pads 70*a* and 70*b* and the first shorting wires 92*a* and 92*b* may extend across the bending area BDA. At least one of the wire connecting one end 15*a* of the crack sensing lines 150M1 and 150M2 and the first input pads 70*a* and 70*b* and the first shorting wires 92*a* and 92*b* may include at least one contact part positioned at upper and lower peripheries of the bending area BDA. The contact part may include at least one contact hole.

Other structures and effects of the display panel 1000*a* according to the exemplary embodiment shown in FIG. 4 are substantially the same as the above-described display panel 1000 such that a detailed description of the remaining components is omitted to avoid redundancy.

Figure 5:
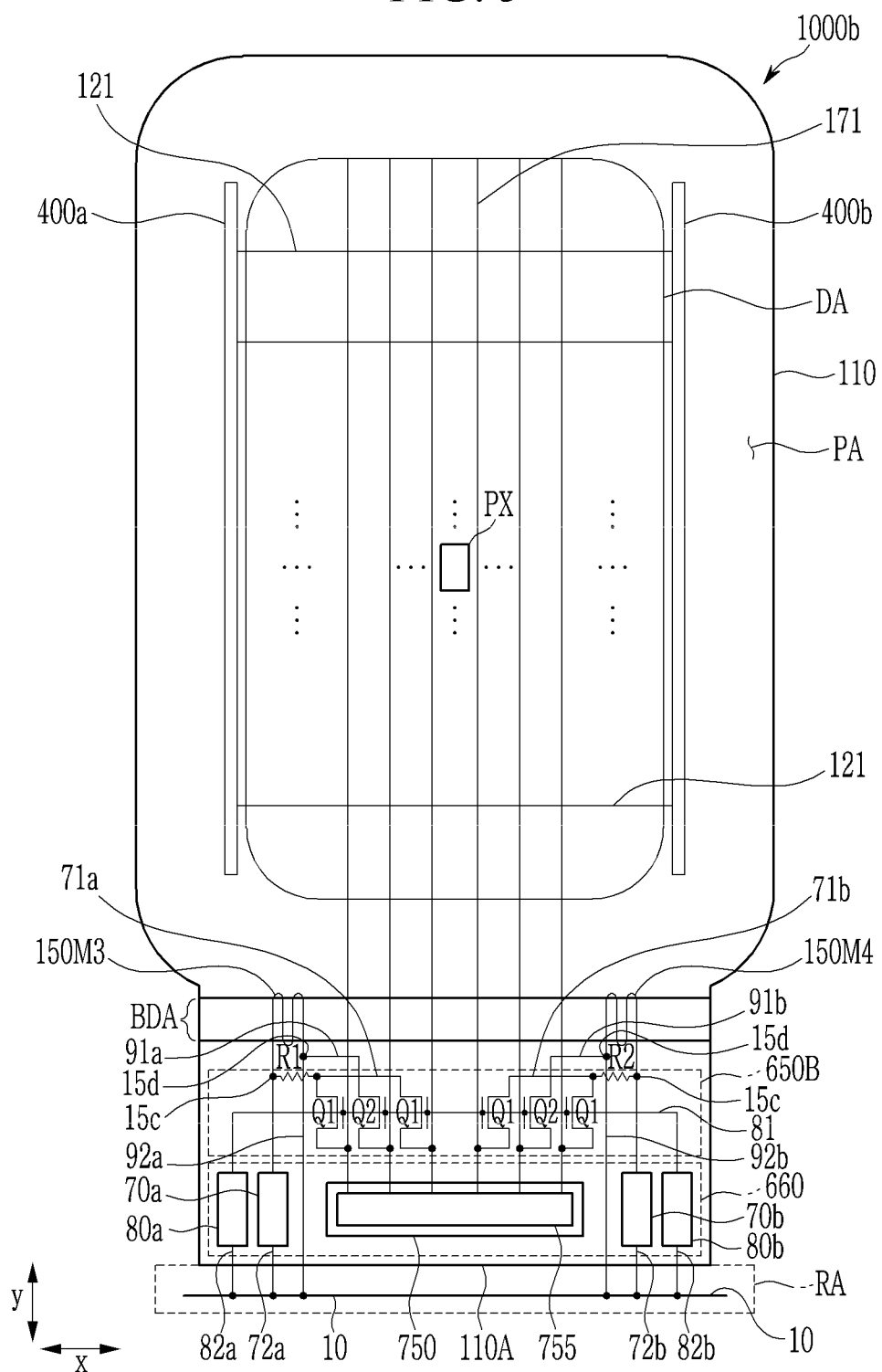

Referring to FIG. 5 along with the above-described drawings, a display panel 1000*b* included in the display device is substantially the same as most of the display panel 1000 according to the exemplary embodiment shown in FIG. 1 and FIG. 2, however bending crack sensing lines 150M3 and 150M4 may be included.

The bending crack sensing lines 150M3 and 150M4 used to detect whether the defect such as the crack of the bending area BDA occurs or not, unlike the crack sensing lines 150M1 and 150M2 described above, may be located to be limited to the bending area BDA and its surroundings. In detail, the bending crack sensing lines 150M3 and 150M4 may be positioned at the left/right edge areas of the bending area BDA, and may start from one end 15*c* connected to the pad area 660, extend in the approximately y direction, loop back and forth once or more times in a generally sinusoidal type manner within the bending area BDA to form the bending part, and then be returned to be connected to the circuit area 650B in another end 15*d*. One end 15*c* of the bending crack sensing lines 150M3 and 150M4 may be connected to the pad area 660 for receiving the test voltage.

When the cross-sectional position of the conductive layer positioned at the bending area BDA and the cross-sectional position of the bending crack sensing lines 150M3 and 150M4 positioned outside the bending area BDA are not equal to each other, the bending crack sensing lines 150M3 and 150M4 may include at least one contact part located around the upper and lower sides of the area BDA. The bending crack sensing lines 150M3 and 150M4 may include parts positioned at different layers from each other when viewed in cross-section based on the contact part. The contact part may include at least one contact hole.

FIG. 5 only shows the bending crack sensing lines 150M3 and 150M4 and the above-described crack sensing lines 150M1 and 150M2 are omitted, however the crack sensing lines 150M1 and 150M2 may also be included along with the bending crack sensing lines 150M3 and 150M4. In this case, an additional crack sensing circuit connected to the crack sensing lines 150M1 and 150M2 may be further formed, and a configuration of the crack sensing circuit may be the same as that of the crack sensing circuit of the above-described circuit area 650. Also, in the bending area BDA, the bending crack sensing line 150M3 positioned at the left side may be positioned between the crack sensing line 150M1 and the edge of the substrate 110, and the bending crack sensing line 150M4 positioned at the right side may be positioned between the crack sensing line 150M2 and the edge of the substrate 110.

In addition, the configuration such as the connection relationship of the bending crack sensing lines 150M3 and 150M4 and the circuit area 650 of the display panel 1000*b* and the effects thereof are substantially the same as the connection configuration such as the relationship of the crack sensing lines 150M1 and 150M2 and the circuit area 650 of the above-described display panel 1000 such that the detailed description of the remaining components is omitted to avoid redundancy.

Next, the method of testing the defect such as the crack of the display panels 1000, 1000a, and 1000b according to an exemplary embodiment will be described.

First, a test voltage is applied to one end 15a of the crack sensing lines 150M1 and 150M2 and/or one end 15c of the bending crack sensing lines 150M3 and 150M4, and the first test data lines 71a and 71b through the pad area 660. Also, if a gate signal of a gate-on voltage is applied to the test gate line 81, the first and second switching elements Q1 and Q2 of the circuit areas 650 and 650B are turned on, and the test voltage applied to the first test data line 71a and 71b is applied to the corresponding data line 171 through the turned-on first switching element Q1. The test voltage as a predetermined voltage may be, for example, a voltage to display the pixel PX with a lowest gray, and in this case, it may be an approximately 7 V. Accordingly, the pixels PX connected to the turned-on first switching element Q1 may display the low gray such as black.

If a defect such as a crack, the lifting, etc. is not generated in the peripheral area PA and/or the bending area BDA of the display panels 1000, 1000a, and 1000b, i.e., the display is in a normal state in which the crack sensing lines 150M1 and 150M2 and/or the bending crack sensing lines 150M3 and 150M4 are not damaged, the voltage applied to the test data lines 91a and 91b of the circuit areas 650 and 650B through the crack sensing lines 150M1 and 150M2 and/or the bending crack sensing lines 150M3 and 150M4 may be substantially the same as the voltage applied to the first test data lines 71a and 71b. For this, the matching resistors R1 and R2 may be controlled. In this case, the pixels PX connected to the second switching element Q2 may also display the predetermined gray such as black like the pixels PX connected to the first switching element Q1.

However, if a defect such as a crack, the lifting, etc. is generated in the peripheral area PA and/or the bending area BDA of the display panels 1000, 1000a, and 1000b, i.e., if the crack sensing lines 150M1 and 150M2 and/or the bending crack sensing lines 150M3 and 150M4 are disconnected or damaged such that the wire resistance is increased, a black data voltage is not applied to the pixels PX connected to the second switching element Q2 or the black data voltage is not sufficiently applied. Accordingly, a hard white line or a weak white line may be recognized along the column of the pixels PX connected to the second switching element Q2. As above-described, a defect such as the crack generated in the peripheral area PA and/or the bending area BDA of the display panels 1000, 1000a, and 1000b may be detected visually through the recognized white line.

Now, the cross-sectional structure of the display device according to an exemplary embodiment will be described with reference to FIG. 6 along with FIG. 1 to FIG. 5 as described above.

Figure 6:
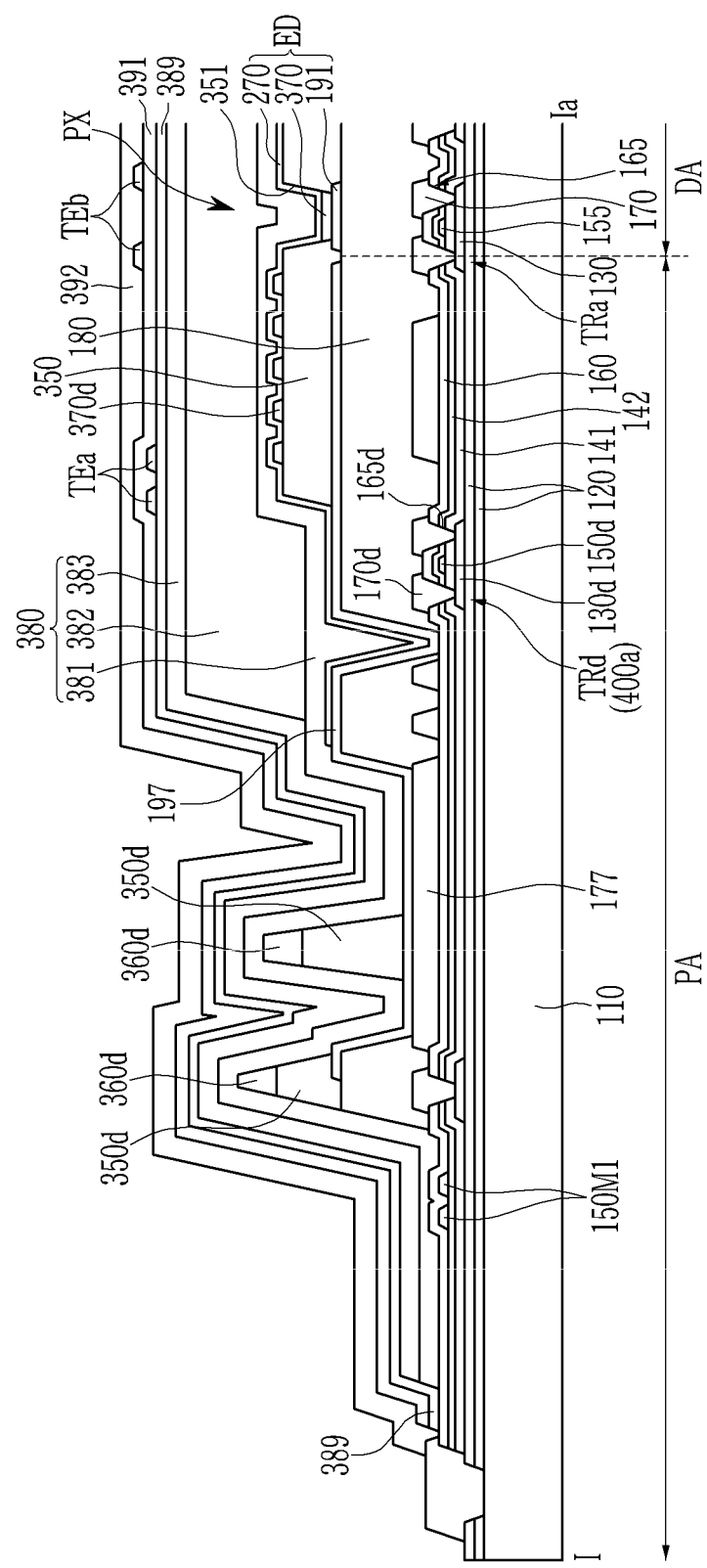
FIG. 6 is a cross-sectional view of the display device shown in FIG. 1 taken along a line I-Ia.

FIG. 6 is a cross-sectional view of the display device shown in FIG. 1 taken along a line I-Ia. Referring to FIG. 6, a barrier layer 120 may be positioned on a substrate 110. The barrier layer 120 may include a plurality of layers as shown in the drawing or may be made of a single layer.

An active pattern is positioned on the barrier layer 120. The active pattern may include an active pattern 130 positioned at the display area DA and an active pattern 130d positioned at the peripheral area PA. Each of the active patterns 130 and 130d may include a source region and a drain region, and a channel region therebetween. The active pattern may include amorphous silicon, polysilicon, or an oxide semiconductor.

A first insulating layer 141 may be positioned on the active patterns 130 and 130d, and a first conductive layer may be positioned on the first insulating layer 141. The first conductive layer may include a conductor 155 overlapping the active pattern 130 positioned at the display area DA, a conductor 150d overlapping the active pattern 130d positioned at the peripheral area PA, and the plurality of gate lines 121 and the test gate line 81 as above-described.

The active pattern 130 and the conductor 155 overlapping thereto may together form a transistor TRa, and the active pattern 130d and the conductor 150d overlapping thereto may together form a transistor TRd. The transistor TRa may function as a switching element included in the pixel PX positioned at the display area DA, and the transistor TRd may function as a switching element included in the gate drivers 400a and 400b. The detailed structure of the pixel PX will be described later.

A second insulating layer 142 may be positioned on the first conductive layer and the first insulating layer 141, and a second conductive layer may be positioned on the second insulating layer 142. The second conductive layer may include the above-described crack sensing lines 150M1 and 150M2. Alternatively, the crack sensing lines 150M1 and 150M2 may be positioned at the same layer as and may include the same material as the first conductive layer.

The second conductive layer may further include the above-described test data lines 71a, 71b, 91a, and 91b, and the like. Alternatively, at least one among the test data lines 71a, 71b, 91a, and 91b may be positioned at the first conductive layer.

A third insulating layer 160 may be positioned on the second conductive layer and second insulating layer 142.

At least one of the first insulating layer 141, the second insulating layer 142, and the third insulating layer 160 may include an inorganic insulating material such as a silicon nitride (SiNx), a silicon oxide (SiOx), a silicon oxynitride (SiON), and/or an organic insulating material. At least one entire or part among the first insulating layer 141, the second insulating layer 142, and the third insulating layer 160 may be removed in the bending area BDA.

The first insulating layer 141, the second insulating layer 142, and the third insulating layer 160 may include contact holes 165 and 165d positioned at the source region and/or the drain region of the transistors TRa and TRd.

A third conductive layer may be positioned on the third insulating layer 160. The third conductive layer may include conductors 170 and 170d connected to the source area or the drain area of the transistors TRa and TRd through the contact hole 165, a voltage transmitting line 177, and the above-described data line 171.

At least one of the first conductive layer, the second conductive layer, and the third conductive layer may include a metal such as copper (Cu), aluminum (Al), molybdenum (Mo), or alloys thereof.

A passivation layer 180 is positioned on the third conductive layer and the third insulating layer 160. The passivation layer 180 may include the inorganic insulating material and/or the organic insulating material such as a polyacrylic resin and a polyimide-based resin, and an upper surface of the passivation layer 180 may be substantially flat.

A pixel electrode layer is positioned on the passivation layer 180. The pixel electrode layer may include a pixel electrode 191 corresponding to each pixel PX of the display area DA, and a voltage transmitting electrode 197 positioned at the peripheral area PA. The voltage transmitting electrode 197 may be physically and electrically connected to the voltage transmitting line 177 for receiving a common voltage ELVSS. The pixel electrode layer may include a semi-transmissive conductive material or a reflective conductive material.

A pixel definition layer 350 is positioned on the passivation layer 180 and the pixel electrode layer. The pixel definition layer 350 may have an opening 351 formed on the pixel electrode 191, and may further include at least one dam portion 350d positioned at the peripheral area PA. The dam portion 350d may extend substantially parallel to the edge of the substrate 110 in a plan view. A spacer 360d may be further positioned on the dam portion 350d.

The crack sensing lines 150M1 and 150M2 may be positioned outside of the dam portion 350d, but are not limited thereto.

The pixel definition layer 350 may include a photosensitive material such as the polyacrylic resin and the polyimide-based resin.

An emission layer 370 is positioned on the pixel electrode 191. The emission layer 370 may include a portion positioned in the opening 351 of the pixel definition layer 350. The emission layer 370 may further include at least one dummy emission layer 370d positioned at the peripheral area PA and positioned on the pixel definition layer 350. The emission layer 370 may include an organic emission material or an inorganic emission material.

A common electrode 270 is positioned on the emission layer 370. The common electrode 270 is also formed on the pixel definition layer 350, thereby the common electrodes 270 may be continuously formed throughout the plurality of pixels PX. The common electrode 270 may be physically and electrically connected to the voltage transmitting electrode 197 in the peripheral area PA for receiving the common voltage ELVSS. The common electrode 270 may include a conductive transparent material.

The pixel electrode 191, the emission layer 370, and the common electrode 270 of each pixel PX together form a light emitting diode (LED) ED, one of the pixel electrode 191 and the common electrode 270 becomes a cathode, while the other becomes an anode.

An encapsulating portion 380 protecting and encapsulating the light emitting diode (LED) ED may be positioned on the common electrode 270. The encapsulating portion 380 includes at least one of inorganic layers 381 and 383 and at least one organic layer 382, and at the least one of inorganic layers 381 and 383 and the at least one organic layer 382 may be alternately stacked. The organic layer 382 includes the organic material and may have a flattening characteristic. The inorganic layers 381 and 383 may include an inorganic material such as an aluminum oxide (AlOx), a silicon oxide (SiOx), a silicon nitride (SiNx), and a silicon oxynitride (SiON).

Since a plane area of the inorganic layers 381 and 383 is wider than a plane area of the organic layer 382, the two inorganic layers 381 and 383 may be vertically in contact with each other in the peripheral area PA. The inorganic layer 381 positioned at the bottom of the inorganic layers 381 and 383 may be in contact with the upper surface of the third insulating layer 160 in the peripheral area PA, but the inventive concepts are not limited thereto. In the peripheral area PA, the encapsulating portion 380 including the inorganic layers 381 and 383 may overlap the crack sensing lines 150M1 and 150M2.

The edge of the organic layer 382 included in the encapsulating portion 380 may be positioned between the dam portion 350d and the display area DA. The dam portion 350d may function to prevent the organic material from overflowing outside when forming the organic layer 382 of the encapsulating portion 380, and accordingly the outer edge of the organic layer 382 of the encapsulating portion 380 may be approximately positioned more inside than the dam portion 350d.

A buffer layer 389 including the inorganic insulating material or/and the organic insulating material may be positioned on the encapsulating portion 380. The buffer layer 389 may be omitted.

A fourth conductive layer is positioned on the buffer layer 389. The fourth conductive layer may include a first touch conductor TEa. A first touch insulating layer 391 may be positioned on the fourth conductive layer, and a fifth conductive layer may be positioned thereon. The fifth conductive layer may include a second touch conductor TEb. A second touch insulating layer 392 may be positioned on the fifth conductive layer. As the first touch conductor TEa and/or the second touch conductor TEb form a capacitive touch sensor, the touch of an external object may be sensed. At least one of the first touch conductor TEa and the second touch conductor TEb may be omitted.

Next, one example of the detailed structure of one pixel PX included in the display device according to an exemplary embodiment will be described with reference to FIG. 7 and FIG. 8 along with FIG. 1 to FIG. 6 described above.

Figure 7:
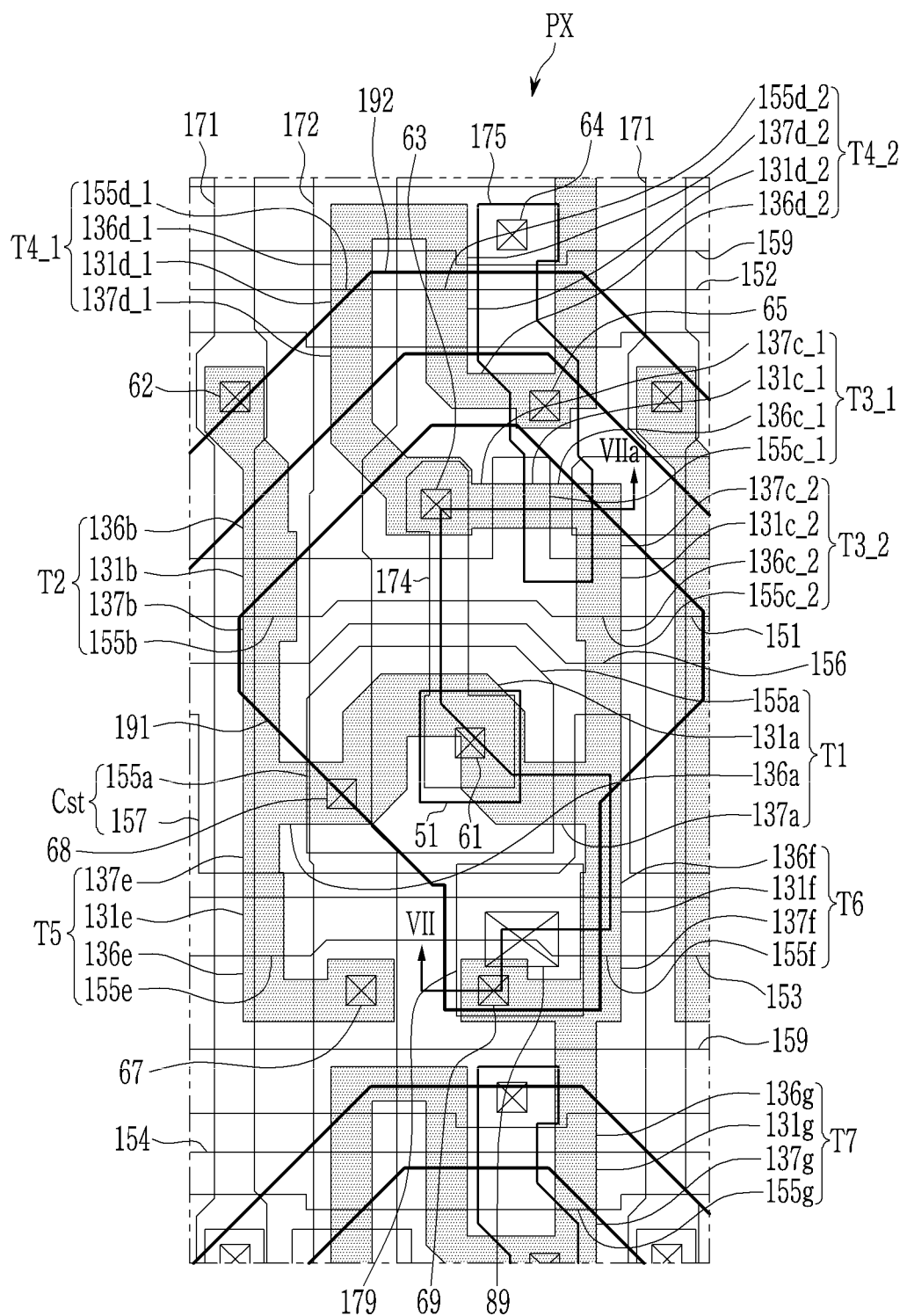
FIG. 7 is a plan layout view of an exemplary embodiment of a pixel that may be used in display devices constructed according to the principles of the invention.
Figure 8:
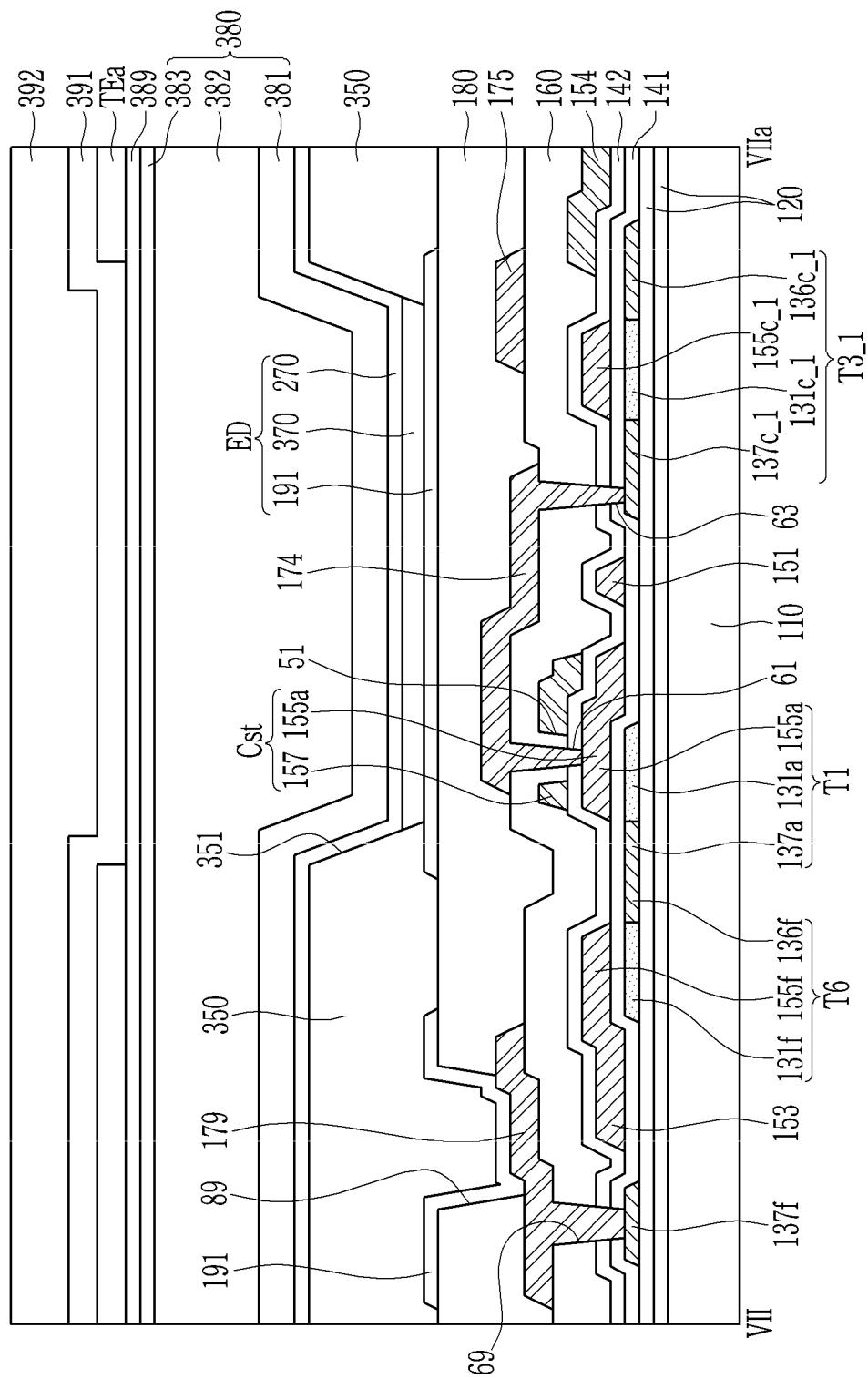
FIG. 8 is a cross-sectional view of the display device shown in FIG. 7 taken along a line VII-VIIa.

FIG. 7 is a plan layout view of an exemplary embodiment of a pixel that may be used in display devices constructed according to the principles of the invention and FIG. 8 is a cross-sectional view of the display device shown in FIG. 7 taken along a line VII-VIIa. The display device according to an exemplary embodiment includes a first scan line 151, a second scan line 152, and a third scan line 154 transmitting a scan signal, and a control line 153 transmitting a light emission control signal. The plurality of scan lines 151, 152, and 154 and the control line 153 may be included in the above-described gate line 121, and may be included in the above-described first conductive layer on a cross-section.

The display device according to an exemplary embodiment may further include a storage line 156 and an initialization voltage line 159 transmitting an initialization voltage, and they may be included in the above-described second conductive layer. The storage line 156 may include an expansion 157 positioned in each pixel PX.

The display device according to an exemplary embodiment may further include a data line 171 and a driving voltage line 172, and they may be further included in the above-described third conductive layer on a cross-section. The data line 171 and the driving voltage line 172 extend in approximately the same direction (e.g., in the vertical direction in FIG. 7) on a plane, thereby intersection the plurality of scan lines 151, 152, and 154. The expansion 157 of the storage line 156 is connected to the driving voltage line 172 through a contact hole 68 for receiving a driving voltage ELVDD.

Each pixel PX may include a plurality of transistors T1, T2, T3_1, T3_2, T4_1, T4_2, T5, T6, and T7 and a capacitor Cst that are connected to the scan lines 151, 152, and 154, the control line 153, the data line 171, and the driving voltage line 172. The plurality of transistors T1, T2, T3_1, T3_2, T4_1, T4_2, T5, T6, and T7 may be included in the above-described transistor TRa. Each channel of the plurality of transistors T1, T2, T3_1, T3_2, T4_1, T4_2, T5, T6, and T7 may be formed inside the above-described active pattern 130. The active pattern 130 include channel areas 131a, 131b, 131c_1, 131c_2, 131d_1, 131d_2, 131e, 131f, and 131g forming each channel of the transistors T1, T2, T3_1, T3_2, T4_1, T4_2, T5, T6, and T7, and a conductive area. The conductive area of the active pattern 130 is positioned at both sides of each of the channel areas 131a, 131b, 131c_1, 131c_2, 131d_1, 131d_2, 131e, 131f, and 131g, and has a higher carrier concentration than the channel areas 131a, 131b, 131c_1, 131c_2, 131d_1, 131d_2, 131e, 131f, and 131g. A pair of conductive areas positioned at both sides of the channel areas 131a, 131b, 131c_1, 131c_2, 131d_1, 131d_2, 131e, 131f, and 131g of each of the transistors T1, T2, T3_1, T3_2, T4_1, T4_2, T5, T6, and T7 as a source area and a drain area of the corresponding transistors T1, T2, T3_1, T3_2, T4_1, T4_2, T5, T6, and T7 may function as a source electrode and a drain electrode.

The first transistor T1 includes the channel area 131a, a source area 136a and a drain area 137a, and a driving gate electrode 155a overlapping the channel area 131a on a plane. The driving gate electrode 155a may be included in the first conductive layer and may be connected to a connecting member 174 through a contact hole 61. The connecting member 174 may be included in the above-described third conductive layer on a cross-section. The contact hole 61 may be positioned within a contact hole 51 included in the expansion 157.

The second transistor T2 includes the channel area 131b, a source area 136b and a drain area 137b, and a gate electrode 155b overlapping the channel area 131b on a plane. The gate electrode 155b is a part of the first scan line 151. The source area 136b is connected to the data line 171 through a contact hole 62, and the drain area 137b is connected to the source area 136a of the first transistor T1.

The third transistor T3_1 and T3_2 may include an upper third transistor T3_1 and a lower third transistor T3_2 connected to each other. The upper third transistor T3_1 includes the channel area 131c_1, a source area 136c_1, and a drain area 137c_1, and a gate electrode 155c_1 overlapping the channel area 131c_1. The gate electrode 155c_1 may be a part of the first scan line 151. The drain area 137c_1 is connected to the connecting member 174 through a contact hole 63. The lower third transistor T3_2 includes the channel area 131c_2, a source area 136c_2 and a drain area 137c_2, and a gate electrode 155c_2 overlapping the channel area 131c_2. The gate electrode 155c_2 is a part of the first scan line 151.

The fourth transistor T4_1 and T4_2 may include a left fourth transistor T4_1 and a right fourth transistor T4_2 connected to each other. The left fourth transistor T4_1 includes the channel area 131d_1, a source area 136d_1 and a drain area 137d_1, and a gate electrode 155d_1 overlapping the channel area 131d_1. The gate electrode 155d_1 is a part of the second scan line 152. The drain area 137d_1 is connected to the drain area 137c_1 of the upper third transistor T3_1, and is connected to the connecting member 174 through the contact hole 63. The right fourth transistor T4_2 includes the channel area 131d_2, a source area 136d_2 and a drain area 137d_2, and a gate electrode 155d_2 overlapping the channel area 131d_2. The gate electrode 155d_2 is a part of the second scan line 152. The drain area 137d_2 is connected to the source area 136d_1 of the left fourth transistor T4_1, and the source area 136d_2 is connected to a connecting member 175 though a contact hole 65.

The connecting member 175 may be included in the above-described second conductive layer or third conductive layer on a cross-section. When the connecting member 175 is included in the third conductive layer, the connecting member 175 may be electrically connected to the initialization voltage line 159 through a contact hole 64.

The fifth transistor T5 includes the channel area 131e, a source area 136e and a drain area 137e, and a gate electrode 155e overlapping the channel area 131e. The gate electrode 155e is a part of the control line 153. The source area 136e is connected to the driving voltage line 172 through a contact hole 67, and the drain area 137e is connected to the source area 136a of the first transistor T1.

The sixth transistor T6 includes the channel area 131f, a source area 136f and a drain area 137f, and a gate electrode 155f overlapping the channel area 131f. The gate electrode 155f is a part of the control line 153. The source area 136f is connected to the drain area 137a of the first transistor T1, and the drain area 137f is connected to a connecting member 179 though a contact hole 69. The connecting member 179 may be included in the above-described third conductive layer on a cross-section.

The seventh transistor T7 includes the channel area 131g, a source area 136g and a drain area 137g, and a gate electrode 155g overlapping the channel area 131g. The gate electrode 155g is a part of the third scan line 154. The source area 136g is connected to the drain area 137f of the sixth transistor T6, and the drain area 137g is connected to the connecting member 175 through the contact hole 65 for receiving the initialization voltage.

The capacitor Cst may include the driving gate electrode 155a and the expansion 157 of the storage line 156 as two terminals overlapping each other via the second insulating layer 142 shown in FIG. 6.

The above-described pixel electrode layer may include a pixel electrode 191 and a pixel conductive pattern 192. The pixel electrode 191 is connected to the connecting member 179 through a contact hole 89 for receiving the data voltage. The pixel conductive pattern 192 may be curved according to the edge of the adjacent pixel electrode 191. The pixel conductive pattern 192 may transmit the initialization voltage.

Next, the structure around the bending area BDA of the display device according to an exemplary embodiment will be described with reference to FIG. 9 and FIG. 10 along with the above-described drawings.

Figure 9:
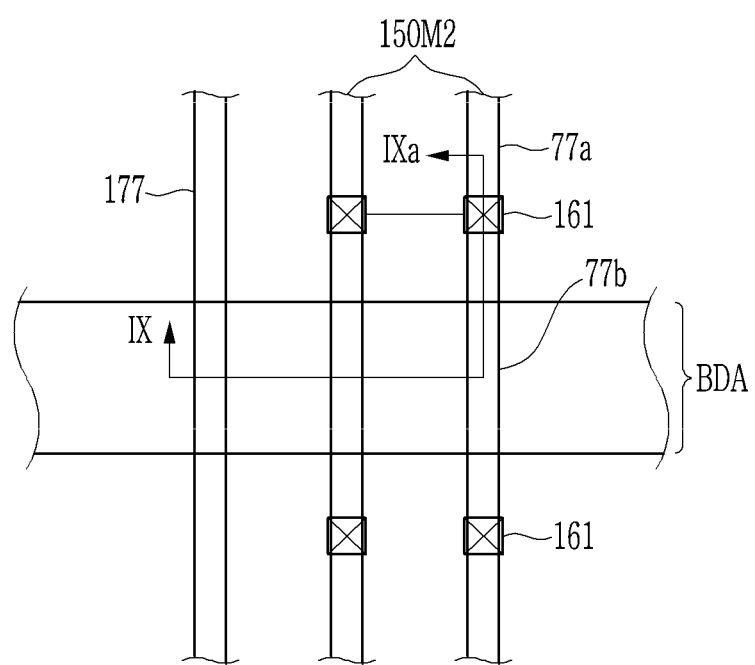
FIG. 9 is a schematic plan view of an exemplary embodiment of a bending area and some of the components extending through the bending area of a display panel constructed according to the principles of the invention.
Figure 10:
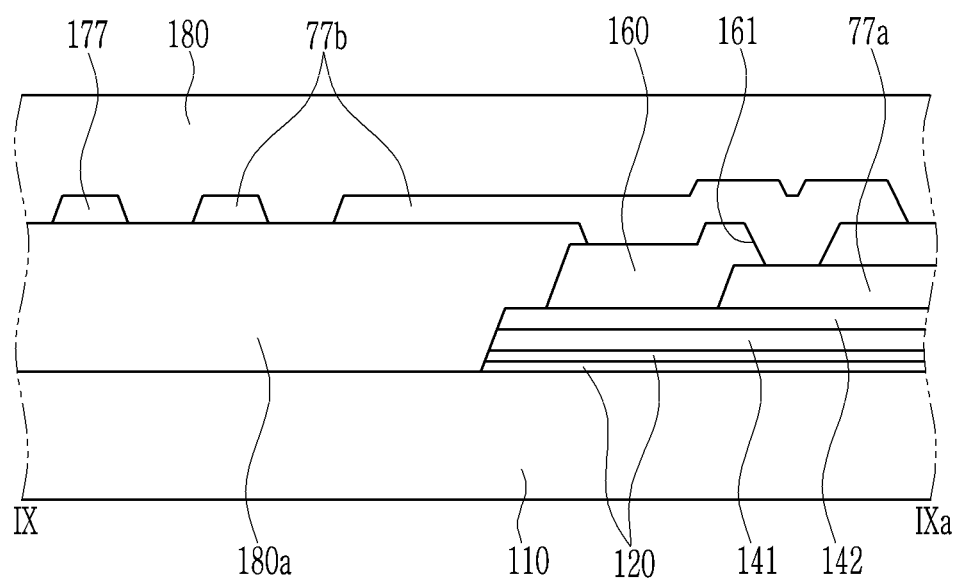
FIG. 10 is a cross-sectional view of the display panel shown in FIG. 9 taken along a line IX-IXa.

FIG. 9 is a schematic plan view of an exemplary embodiment of a bending area and some of the components extending through the bending area of a display panel constructed according to the principles of the invention, and FIG. 10 is a cross-sectional view of the display panel shown in FIG. 9 taken along a line IX-IXa. As above-described, the crack sensing lines 150M1 and 150M2 or the bending crack sensing lines 150M3 and 150M4 may include the contact part positioned around the bending area BDA, and the contact part may include a contact hole 161.

For example, FIG. 9 only shows the crack sensing line 150M2, however the crack sensing line 150M1 and the bending crack sensing lines 150M3 and 150M4 may also have the structure as described. Specifically, the crack sensing lines 150M2 may include a wire 77a not passing through the bending area BDA and a wire 77b passing through the bending area BDA, and the wire 77a and the wire 77b may be electrically connected to each other through the contact hole 161 formed in the third insulating layer 160 as shown in FIG. 10.

The wire 77a may be positioned in the second conductive layer or the first conductive layer positioned under the third insulating layer 160, and the wire 77b may be positioned in the third conductive layer positioned on the third insulating layer 160. Accordingly, in the bending area BDA, the wire 77b may be positioned at the same layer as the voltage transmitting line 177.

Referring to FIG. 10, any of the insulating layers positioned on the substrate 110, i.e., the first insulating layer 141, the second insulating layer 142, and the third insulating layer 160 positioned under the third conductive layer, may be removed in the bending area BDA, and the insulating layer 180a may be positioned on the substrate 110. The insulating layer 180a may include the organic insulating material. Accordingly, the display panels 1000, 1000a, and 1000b may be smoothly bent in the bending area BDA, and may prevent the crack from being generated in the first insulating layer 141, the second insulating layer 142, and the third insulating layer 160. The wire 77b positioned in the bending area BDA may be formed of a mesh shape, thereby having high flexibility.

Next, the detailed structure of the circuit area 650 and the pad area 660 of the display panels 1000, 1000a, and 1000b according to the above-described exemplary embodiments will be described with reference to FIG. 11 and FIG. 12 along with the above-described drawings.

Figure 11:
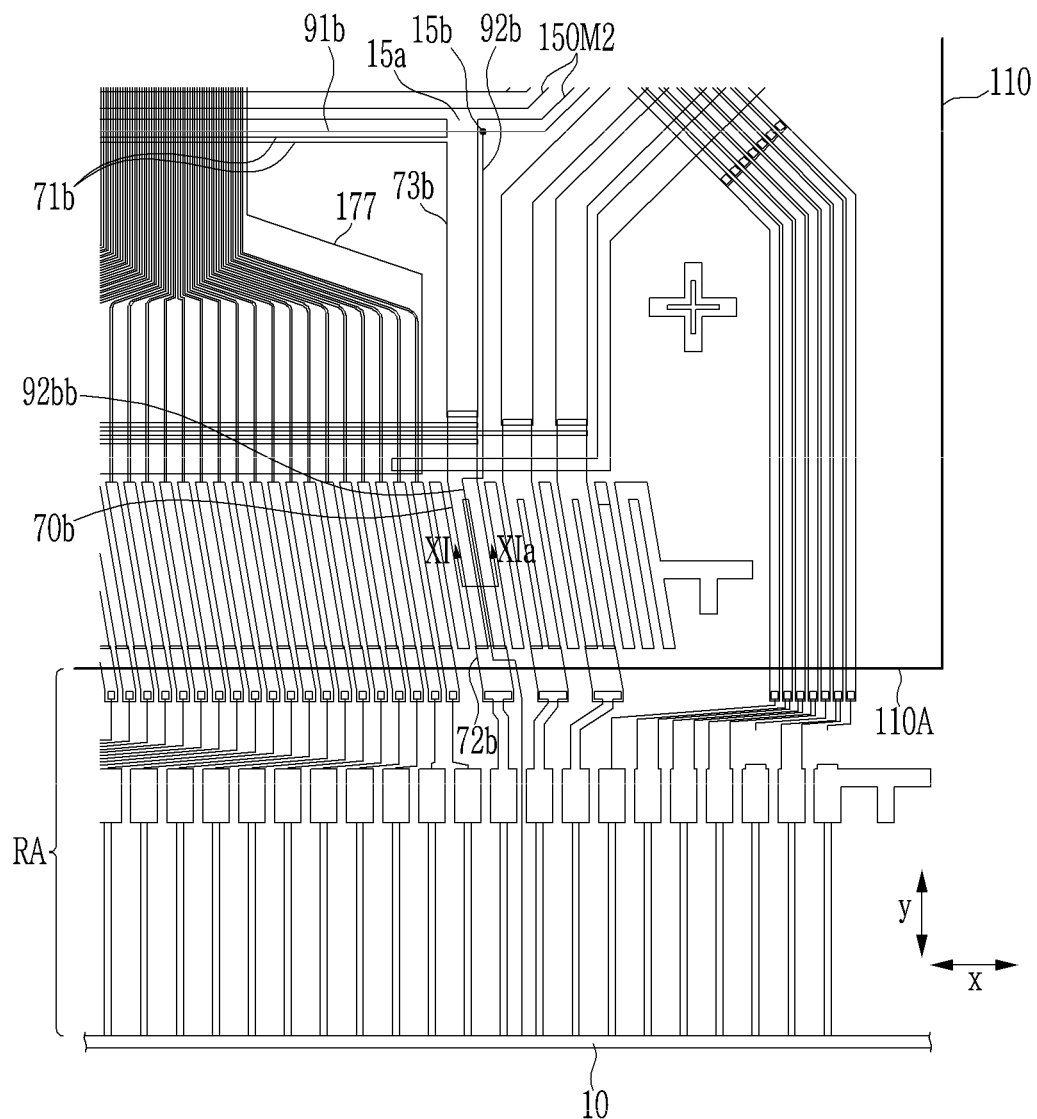
FIG. 11 is a plan layout view showing an exemplary embodiment of part of a circuit area and a pad area during a manufacturing process of a display panel. o
Figure 12:
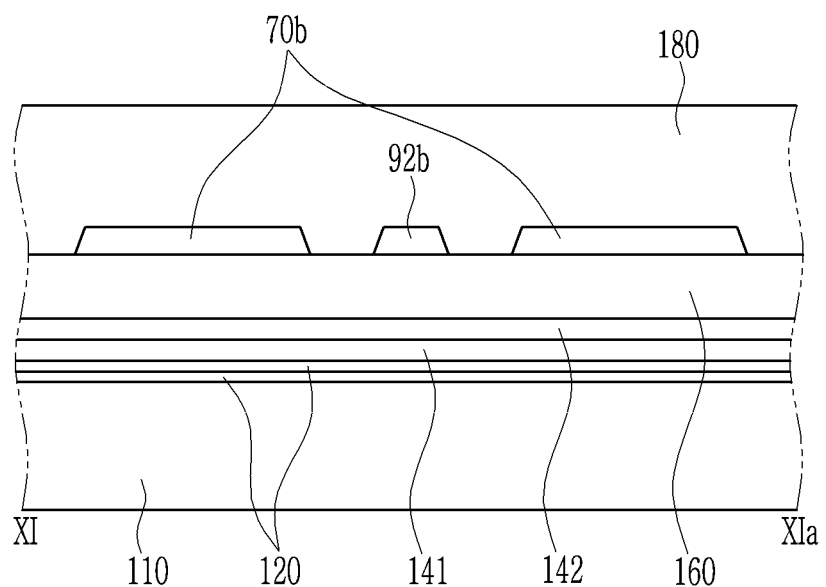
FIG. 12 is a cross-sectional view of the display panel shown in FIG. 11 taken along a line XI-XIa.

FIG. 11 is a plan layout view showing an exemplary embodiment of part of a circuit area and a pad area during a manufacturing process of a display panel, and FIG. 12 is a cross-sectional view of the display panel shown in FIG. 11 taken along a line XI-XIa.

The first input pad 70b is positioned around the lower edge 110A of the substrate 110, a wire 73b connected to the first input pad 70b approximately extends in the y direction, and one end 15a of the first test data line 71b and the crack sensing line 150M2 is connected to the end of the wire 73b. The other end 15b of the crack sensing line 150M2 is connected to the second test data line 91b and the first shorting wire 92b, and the first shorting wire 92b may extend approximately parallel to the y direction to be adjacent to the wire 73b connected to the first input pad 70b. The first test data lines 71b and the second test data lines 91b cross the voltage transmitting line 177 and may approximately extend in the x direction. The first shorting wire 92b is insulated from the first input pad 70b and extends to the lower edge 110A after crossing the first input pad 70b. The part extending adjacent to the wire 73b among the first shorting wire 92b is positioned at the same layer as the first input pad 70b (e.g., the third conductive layer), and then may pass the first input pad 70b after being changed into the different layer (indicated by 92bb, e.g., the first conductive layer or the second conductive layer) from the first input pad 70b before overlapping the input pad 70b. Also, as shown in FIG. 11 and FIG. 12, in the part where the first shorting wire 92b passes through the removed area inside the first input pad 70b, the first shorting wire 92b may be again positioned at the same layer as the first input pad 70b (e.g., the third conductive layer).

Like FIG. 1, FIG. 4, and FIG. 5 described above, FIG. 11 also shows the removal area RA that is only present during the manufacturing process. The first shorting wire 92b may extend to the removal area RA during the manufacturing process of the display panel to be electrically connected to the shorting bar 10 transmitting the predetermined voltage such as the ground voltage. The second shorting wire 72b connected to the first input pad 70b may also extend to the shorting bar 10 in the removal area RA to be electrically connected to the shorting bar 10. In FIG. 11, the second shorting wire 72b has substantially the same width as the first input pad 70b so that it may be regarded as an extended part of the first input pad 70b.

Accordingly, during the manufacturing process of the display panel, the static electricity collected in the other end 15b of the crack sensing line 150M2 and the periphery thereof may be discharged to the shorting bar 10 through the first shorting wire 92b, and the one end 15a and the other end 15b of the crack sensing line 150M2 may maintain the same potential. The effect thereof is as described above. The removal area RA under the lower edge 110A is removed such that the first shorting wires 92b and the second shorting wire 72b remain in a state of being extended to the lower edge 110A of the display panels 1000, 1000a, and 1000b or the substrate 110.

The several wires shown in FIG. 11 may be positioned in at least one among the first conductive layer, the second conductive layer, and the third conductive layer as above-described. For example, as shown in FIG. 12, the first input pad 70b and the first shorting wire 92b are positioned in the third conductive layer positioned between the third insulating layer 160 and the passivation layer 180, and may be separated from each other. In addition, referring to the description of FIG. 6, the third conductive layer may include the voltage transmitting line 177 and the plurality of data lines 171, and thus by combining with FIG. 4, the voltage transmitting line 177 and the first shorting wire 92b are positioned at the same layer in the bending area BDA; and by combining with FIG. 1, the first shorting wire 92b is positioned at the same layer as the plurality of data lines 171 at the edge of the substrate 110.

Figure 13:
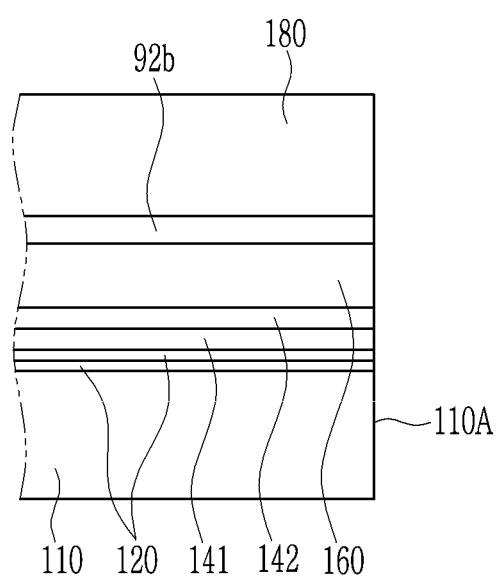
FIG. 13 is a cross-sectional view of an exemplary embodiment of a lower edge of a display panel constructed according to the principles of the invention.

FIG. 13 is a cross-sectional view around the lower edge 110A of the display panels 1000, 1000a, and 1000b or the substrate 110 according to an exemplary embodiment. Referring to FIG. 13, the end of the first shorting wire 92b and the end of the lower edge 110A are positioned on the same plane perpendicular to the upper surface of the substrate 110, and may be aligned in the direction perpendicular to the upper surface of the substrate 110.

The display device according to an exemplary embodiment may be an organic/inorganic emissive display device. However the inventive concepts are not limited thereto, and may be embodied in various display devices such as a liquid crystal display.

According to exemplary embodiments and principles of the invention, a circuit or an electrical element to detect a defect, such as the crack that may be generated in the display panel during manufacture, may be protected from static electricity, and accuracy of the detection of defect during testing of the display panel may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a display area having a plurality of pixels, a pad area having a plurality of input pads, and a circuit area positioned between the pad area and the display area;
   a crack sensor having a first end and a second end, the first end being connected to a first input pad of the plurality of input pads;
   a first shorting element extending through the pad area without connecting to any of the input pads, the first shorting element being connected to the second end and extending to an edge of the substrate;
   a plurality of data lines connected to the plurality of pixels; and
   a crack sensing circuit including a first switching element having an input terminal connected to the first end and an output terminal connected to a first data line of the plurality of data lines, and a second switching element having an input terminal connected to the second end and an output terminal connected to a second data line of the plurality of data lines.

2. The display device of claim 1, wherein the crack sensor further comprises a part extending along a periphery of the display area and connected between the first end and the second end.

3. The display device of claim 1, further comprising a second shorting element connected to the first input pad and extending to the edge of the substrate.

4. The display device of claim 3, further comprising:
a first test data line connecting the first end and the first switching element to each other; and
a second test data line connecting the second end and the second switching element to each other.

5. The display device of claim 3, further comprising a first wire connecting the first end and the first input pad to each other,
wherein the first shorting element comprises a part extending substantially parallel to the first wire.

6. The display device of claim 1, wherein
the substrate further comprises a bending area positioned between the display area and the circuit area,
the crack sensor comprises a part positioned at the bending area,
the display device further comprises a voltage transmitting line having a part extending along a periphery of the display area and a part extending through the bending area, and
wherein the voltage transmitting line and the crack sensor are positioned at the same layer in the bending area.

7. The display device of claim 6, wherein the crack sensor further comprises a line having a generally looped shape extending back and forth once or more times within the bending area, and the line is connected between the first end and the second end.

8. The display device of claim 6, wherein
the first shorting element is positioned between the bending area and the edge of the substrate.

9. The display device of claim 1, wherein
the substrate further comprises a bending area positioned between the circuit area and the pad area,
the first shorting element intersects the bending area,
the display device further comprises a voltage transmitting line having a part extending along a periphery of the display area and a part extending through the bending area, and
wherein the voltage transmitting line and the first shorting element are positioned at the same layer in the bending area.

10. The display device of claim 1, wherein
the first shorting element is positioned at the same layer as the plurality of data lines at the edge of the substrate.

11. The display device of claim 1, further comprising a lighting circuit connected to the plurality of data lines and positioned between the edge of the substrate and the crack sensing circuit,
wherein the first shorting element comprises a part positioned between the lighting circuit and the first input pad.

12. The display device of claim 1, wherein the crack sensor comprises a line, and the first shorting element comprises a wire.

13. A display panel comprising:
a substrate including a display area having a plurality of pixels, a pad area having a plurality of input pads, and a circuit area positioned between the pad area and the display area;
a crack sensor having a first end connected to a first input pad of a plurality of input pads and a second end;
a plurality of data lines connected to the plurality of pixels;
a shorting member transmitting a predetermined voltage;
a first shorting element passing through the pad area without connecting to any of the input pads, the first shorting element being connected between the second end and the shorting member; and
a crack sensing circuit including a first switching element having an input terminal connected to the first end and an output terminal connected to a first data line of the plurality of data lines, and a second switching element having an input terminal connected to the second end and an output terminal connected to a second data line of the plurality of data lines.

14. The display panel of claim 13, wherein the crack sensor further comprises a part extending along a periphery of the display area connected between the first end and the second end.

15. The display panel of claim 13, further comprising a second shorting element connected to the first input pad and connected to the shorting member.

16. The display panel of claim 15, further comprising a first wire connecting the first end and the first input pad to each other,
wherein the first shorting element comprises a part extending substantially parallel to the first wire.

17. The display panel of claim 15, wherein
the substrate further comprises a bending area positioned between the display area and the circuit area, and
the first shorting element is positioned between the bending area and the shorting member.

18. The display panel of claim 17, wherein the crack sensor further comprises a line having a generally looped shape extending back and forth once or more times within the bending area, and the line is connected between the first end and the second end.

19. The display panel of claim 13, wherein
the first shorting element comprises a part positioned at the same layer as the plurality of data lines.

20. The display panel of claim 13, further comprising a lighting circuit connected to the plurality of data lines and positioned between the shorting member and the crack sensing circuit,
wherein the first shorting element comprises a part positioned between the lighting circuit and the first input pad.

* * * * *